(12) United States Patent
Lee et al.

(10) Patent No.: US 7,321,162 B1
(45) Date of Patent: *Jan. 22, 2008

(54) SEMICONDUCTOR PACKAGE HAVING REDUCED THICKNESS

(75) Inventors: Tae Heon Lee, Kuri-shi (KR); Mu Hwan Seo, Aspen Heights (SG)

(73) Assignee: Amkor Technology, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/492,481

(22) Filed: Jul. 25, 2006
(Under 37 CFR 1.47)

Related U.S. Application Data

(62) Division of application No. 10/763,859, filed on Jan. 23, 2004, now Pat. No. 7,115,445, which is a division of application No. 09/687,585, filed on Oct. 13, 2000, now Pat. No. 6,696,747.

(30) Foreign Application Priority Data

Oct. 15, 1999 (KR) ............................. 1999-44651

(51) Int. Cl.
*H01L 23/495* (2006.01)
(52) U.S. Cl. ..................................... 257/676; 257/666
(58) Field of Classification Search ............... 257/676, 257/666

See application file for complete search history.

(56) References Cited

U.S. PATENT DOCUMENTS 2,596,993 A    5/1952    Gookin
3,435,815 A    4/1969    Forcier
3,734,660 A    5/1973    Davies et al.
3,838,984 A    10/1974   Crane et al.

(Continued)

FOREIGN PATENT DOCUMENTS

DE       19734794 A1    8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner*—Phat X Cao
(74) *Attorney, Agent, or Firm*—Stetina Brunda Garred & Brucker

(57) ABSTRACT

A semiconductor package is disclosed that comprises a chip paddle and a semiconductor chip that has a plurality of bond pads. The semiconductor chip is located on an upper surface of the chip paddle. Leads are formed at intervals along the perimeter of the chip paddle. The leads are in electrical communication with the bond pads. The semiconductor chip, the chip paddle and the leads are encapsulated by an encapsulation material. The height of the semiconductor package of the invention is minimized by half etching the chip paddle to reduce the thickness of the chip paddle such that the thickness of the chip paddle is less than the thickness of the leads. Preferably, the chip paddle of the present invention is about 25-75% of the thickness of the leads.

20 Claims, 4 Drawing Sheets

U.S. PATENT DOCUMENTS

| | | | |
|---|---|---|---|
| 4,054,238 A | 10/1977 | Lloyd et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,122,860 A | 6/1992 | Kichuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |

| | | | | | | |
|---|---|---|---|---|---|---|
| 5,877,043 A | 3/1999 | Alcoe et al. | | 6,229,205 B1 | 5/2001 | Jeong et al. |
| 5,886,397 A | 3/1999 | Ewer | | 6,239,367 B1 | 5/2001 | Hsuan et al. |
| 5,886,398 A | 3/1999 | Low et al. | | 6,239,384 B1 | 5/2001 | Smith et al. |
| 5,894,108 A | 4/1999 | Mostafazadeh et al. | | 6,242,281 B1 | 6/2001 | Mclellan et al. |
| 5,897,339 A | 4/1999 | Song et al. | | 6,256,200 B1 | 7/2001 | Lam et al. |
| 5,900,676 A | 5/1999 | Kweon et al. | | 6,258,629 B1 | 7/2001 | Niones et al. |
| 5,903,049 A | 5/1999 | Mori | | 6,281,566 B1 | 8/2001 | Magni |
| 5,903,050 A | 5/1999 | Thurairajaratnam et al. | | 6,281,568 B1 * | 8/2001 | Glenn et al. ............... 257/684 |
| 5,909,053 A | 6/1999 | Fukase et al. | | 6,282,095 B1 | 8/2001 | Houghton et al. |
| 5,915,998 A | 6/1999 | Stidham et al. | | 6,285,075 B1 | 9/2001 | Combs et al. |
| 5,917,242 A | 6/1999 | Ball | | 6,291,271 B1 | 9/2001 | Lee et al. |
| 5,939,779 A | 8/1999 | Kim | | 6,291,273 B1 | 9/2001 | Miyaki et al. |
| 5,942,794 A | 8/1999 | Okumura et al. | | 6,294,100 B1 | 9/2001 | Fan et al. |
| 5,951,305 A | 9/1999 | Haba | | 6,294,830 B1 | 9/2001 | Fjelstad |
| 5,959,356 A | 9/1999 | Oh | | 6,295,977 B1 | 10/2001 | Ripper et al. |
| 5,969,426 A | 10/1999 | Baba et al. | | 6,297,548 B1 | 10/2001 | Moden et al. |
| 5,973,388 A | 10/1999 | Chew et al. | | 6,303,984 B1 | 10/2001 | Corisis |
| 5,976,912 A | 11/1999 | Fukutomi et al. | | 6,303,997 B1 | 10/2001 | Lee |
| 5,977,613 A | 11/1999 | Takata et al. | | 6,307,272 B1 | 10/2001 | Takahashi et al. |
| 5,977,615 A | 11/1999 | Yamaguchi et al. | | 6,309,909 B1 | 10/2001 | Ohgiyama |
| 5,977,630 A | 11/1999 | Woodworth et al. | | 6,316,822 B1 | 11/2001 | Venkateshwaran et al. |
| 5,981,314 A | 11/1999 | Glenn et al. | | 6,316,838 B1 | 11/2001 | Ozawa et al. |
| 5,986,333 A | 11/1999 | Nakamura | | 6,323,550 B1 | 11/2001 | Martin et al. |
| 5,986,885 A | 11/1999 | Wyland | | 6,326,243 B1 | 12/2001 | Suzuya et al. |
| 6,001,671 A | 12/1999 | Fjelstad | | 6,326,244 B1 | 12/2001 | Brooks et al. |
| 6,013,947 A | 1/2000 | Lim | | 6,326,678 B1 | 12/2001 | Kamezos et al. |
| 6,018,189 A | 1/2000 | Mizuno | | 6,335,564 B1 | 1/2002 | Pour |
| 6,020,625 A | 2/2000 | Qin et al. | | 6,337,510 B1 | 1/2002 | Chun-Jen et al. |
| 6,025,640 A | 2/2000 | Yagi et al. | | 6,339,255 B1 | 1/2002 | Shin |
| 6,031,279 A | 2/2000 | Lenz | | 6,348,726 B1 | 2/2002 | Bayan et al. |
| RE36,613 E | 3/2000 | Ball | | 6,355,502 B1 | 3/2002 | Kang et al. |
| 6,034,423 A | 3/2000 | Mostafazadeh et al. | | 6,369,447 B2 | 4/2002 | Mori |
| 6,040,626 A | 3/2000 | Cheah et al. | | 6,369,454 B1 | 4/2002 | Chung |
| 6,043,430 A | 3/2000 | Chun | | 6,373,127 B1 | 4/2002 | Baudouin et al. |
| 6,060,768 A | 5/2000 | Hayashida et al. | | 6,380,048 B1 | 4/2002 | Boon et al. |
| 6,060,769 A | 5/2000 | Wark | | 6,384,472 B1 | 5/2002 | Huang |
| 6,072,228 A | 6/2000 | Hinkle et al. | | 6,388,336 B1 | 5/2002 | Venkateshwaran et al. |
| 6,075,284 A | 6/2000 | Choi et al. | | 6,395,578 B1 | 5/2002 | Shin et al. |
| 6,081,029 A | 6/2000 | Yamaguchi | | 6,400,004 B1 | 6/2002 | Fan et al. |
| 6,084,310 A | 7/2000 | Mizuno et al. | | 6,410,979 B2 | 6/2002 | Abe |
| 6,087,715 A | 7/2000 | Sawada et al. | | 6,414,385 B1 | 7/2002 | Huang et al. |
| 6,087,722 A | 7/2000 | Lee et al. | | 6,420,779 B1 | 7/2002 | Sharma et al. |
| 6,100,594 A | 8/2000 | Fukui et al. | | 6,429,508 B1 | 8/2002 | Gang |
| 6,113,473 A | 9/2000 | Costantini et al. | | 6,437,429 B1 | 8/2002 | Su et al. |
| 6,114,752 A | 9/2000 | Huang et al. | | 6,444,499 B1 | 9/2002 | Swiss et al. |
| 6,118,174 A | 9/2000 | Kim | | 6,448,633 B1 | 9/2002 | Yee et al. |
| 6,118,184 A | 9/2000 | Ishio et al. | | 6,452,279 B2 | 9/2002 | Shimoda |
| RE36,907 E | 10/2000 | Templeton, Jr. et al. | | 6,459,148 B1 | 10/2002 | Chun-Jen et al. |
| 6,130,115 A | 10/2000 | Okumura et al. | | 6,464,121 B2 | 10/2002 | Reijnders |
| 6,130,473 A | 10/2000 | Mostafazadeh et al. | | 6,475,827 B1 | 11/2002 | Lee et al. |
| 6,133,623 A | 10/2000 | Otsuki et al. | | 6,476,469 B2 | 11/2002 | Huang et al. |
| 6,140,154 A | 10/2000 | Hinkle et al. | | 6,476,474 B1 | 11/2002 | Hung |
| 6,143,981 A | 11/2000 | Glenn | | 6,482,680 B1 | 11/2002 | Khor et al. |
| 6,169,329 B1 | 1/2001 | Farnworth et al. | | 6,498,099 B1 | 12/2002 | McLellan et al. |
| 6,177,718 B1 | 1/2001 | Kozono | | 6,498,392 B2 | 12/2002 | Azuma |
| 6,181,002 B1 | 1/2001 | Juso et al. | | 6,507,096 B2 | 1/2003 | Gang |
| 6,184,465 B1 | 2/2001 | Corisis | | 6,507,120 B2 | 1/2003 | Lo et al. |
| 6,184,573 B1 | 2/2001 | Pu | | 6,534,849 B1 | 3/2003 | Gang |
| 6,194,777 B1 | 2/2001 | Abbott et al. | | 6,545,332 B2 | 4/2003 | Huang |
| 6,197,615 B1 | 3/2001 | Song et al. | | 6,545,345 B1 | 4/2003 | Glenn et al. |
| 6,198,171 B1 | 3/2001 | Huang et al. | | 6,559,525 B2 | 5/2003 | Huang |
| 6,201,186 B1 | 3/2001 | Daniels et al. | | 6,566,168 B2 | 5/2003 | Gang |
| 6,201,292 B1 | 3/2001 | Yagi et al. | | 6,583,503 B2 | 6/2003 | Akram et al. |
| 6,204,554 B1 | 3/2001 | Ewer et al. | | 6,603,196 B2 | 8/2003 | Lee et al. |
| 6,208,020 B1 | 3/2001 | Minamio et al. | | 6,624,005 B1 | 9/2003 | Di Caprio et al. |
| 6,208,021 B1 | 3/2001 | Ohuchi et al. | | 6,667,546 B2 | 12/2003 | Huang et al. |
| 6,208,023 B1 | 3/2001 | Nakayama et al. | | 7,005,327 B2 | 2/2006 | Kung et al. |
| 6,211,462 B1 | 4/2001 | Carter, Jr. et al. | | 2001/0008305 A1 | 7/2001 | McLellan et al. |
| 6,218,731 B1 | 4/2001 | Huang et al. | | 2001/0014538 A1 | 8/2001 | Kwan et al. |
| 6,222,258 B1 | 4/2001 | Asano et al. | | 2002/0011654 A1 | 1/2002 | Kimura |
| 6,222,259 B1 | 4/2001 | Park et al. | | 2002/0024122 A1 | 2/2002 | Jung et al. |
| 6,225,146 B1 | 5/2001 | Yamaguchi et al. | | 2002/0027297 A1 | 3/2002 | Ikenaga et al. |
| 6,229,200 B1 | 5/2001 | Mclellan et al. | | 2002/0140061 A1 | 10/2002 | Lee |

| | | | |
|---|---|---|---|
| 2002/0140068 A1 | 10/2002 | Lee et al. | |
| 2002/0163015 A1 | 11/2002 | Lee et al. | |
| 2003/0030131 A1 | 2/2003 | Lee et al. | |
| 2003/0073265 A1 | 4/2003 | Hu et al. | |
| 2004/0056277 A1 | 3/2004 | Karnezos | |
| 2004/0061212 A1 | 4/2004 | Karnezos | |
| 2004/0061213 A1 | 4/2004 | Karnezos | |
| 2004/0063242 A1 | 4/2004 | Karnezos | |
| 2004/0063246 A1 | 4/2004 | Karnezos | |
| 2004/0065963 A1 | 4/2004 | Karnezos | |
| 2004/0164387 A1 | 8/2004 | Ikenaga et al. | |

FOREIGN PATENT DOCUMENTS

| | | |
|---|---|---|
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 4098864 | 9/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 6260532 | 9/1994 |
| JP | 7297344 | 11/1995 |
| JP | 7312405 | 11/1995 |
| JP | 864634 | 3/1996 |
| JP | 8083877 | 3/1996 |
| JP | 8125066 | 5/1996 |
| JP | 96-4284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10163401 | 6/1998 |
| JP | 10199934 | 7/1998 |
| JP | 10256240 | 9/1998 |
| JP | 11307675 | 11/1999 |
| JP | 00150765 | 5/2000 |
| JP | 556398 | 10/2000 |
| JP | 2001060648 | 3/2001 |
| JP | 200204397 | 8/2002 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 0049944 | 6/2002 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

SEMICONDUCTOR PACKAGE HAVING REDUCED THICKNESS

CROSS-REFERENCE TO RELATED APPLICATIONS

The present application is a divisional of U.S. application Ser. No. 10/763,859 entitled SEMICONDUCTOR PACKAGE HAVING REDUCED THICKNESS filed Jan. 23, 2004 now U.S. Pat. No. 7,115,445, which is a divisional of U.S. application Ser. No. 09/687,585 entitled SEMICONDUCTOR PACKAGE HAVING REDUCED THICKNESS filed Oct. 13, 2000 and issued as U.S. Pat. No. 6,696,747 on Feb. 24, 2004.

STATEMENT RE: FEDERALLY SPONSORED RESEARCH/DEVELOPMENT

Not Applicable

BACKGROUND OF THE INVENTION

1. Field of the Invention

The present invention relates to a semiconductor package and, more particularly, but not by way of limitation, to a semiconductor package that has a reduced thickness.

2. History of Related Art

It is conventional in the electronic industry to encapsulate one or more semiconductor devices, such as integrated circuit dies, or chips, in a semiconductor package. These plastic packages protect a chip from environmental hazards, and provide a method and apparatus for electrically and mechanically attaching the chip to an intended device. Recently, such semiconductor packages have included metal leadframes for supporting an integrated circuit chip which is bonded to a chip paddle region formed centrally therein. Bond wires which electrically connect pads on the integrated circuit chip to individual leads of the leadframe are then incorporated. A hard plastic encapsulating material, or encapsulant, which covers the bond wire, the integrated circuit chip and other components, forms the exterior of the package. A primary focus in this design is to provide the chip with adequate protection from the external environment in a reliable and effective manner.

As set forth above, the semiconductor package therein described incorporates a leadframe as the central supporting structure of such a package. A portion of the leadframe completely surrounded by the plastic encapsulant is internal to the package. Portions of the leadframe extend internally from the package and are then used to connect the package externally. More information relative to leadframe technology may be found in Chapter 8 of the book *Micro Electronics Packaging Handbook*, (1989), edited by R. Tummala and E. Rymaszewski. This book is published by Van Nostrand Reinhold, 115 Fifth Avenue, New York, N.Y., which is herein incorporated by reference.

Once the integrated circuit chips have been produced and encapsulated in semiconductor packages described above, they may be used in a wide variety of electronic appliances. The variety of electronic devices utilizing semiconductor packages has grown dramatically in recent years. These devices include cellular phones, portable computers, etc. Each of these devices typically include a motherboard on which a significant number of such semiconductor packages are secured to provide multiple electronic functions. These electronic appliances are typically manufactured in reduced sizes and at reduced costs, which has resulted in increased consumer demand. Accordingly, not only are semiconductor chips highly integrated, but also semiconductor packages are highly miniaturized with an increased level of package mounting density.

According to such miniaturization tendency, semiconductor packages, which transmit electrical signals from semiconductor chips to motherboards and support the semiconductor chips on the motherboards, have been designed to have a size of about 1×1 mm.

One obstacle to reducing the thickness of conventional semiconductor packages is the internal leads are as thick as the chip paddle. Under the condition that the thickness of the internal leads is identical to that of the chip paddle, the bond pads on the semiconductor chip that is mounted onto the chip paddle are positioned at a far higher level than are the internal leads, so that the loop height of the conductive wires for connecting the semiconductor chip and the internal leads is elevated. The loop height results in an increase in a wire sweeping phenomenon that is caused by pressure of an encapsulation material during encapsulation of the package components.

Previously, techniques for reducing the thickness of semiconductor packages have been utilized, such as back-grinding techniques in which a semiconductor chip is ground down before being mounted on a chip paddle. The back-grinding process, however, deleteriously affects the semiconductor chip. For example, a semiconductor chip that is thinned in this manner is apt to undergo warping, which may result in damaging the internal integrated circuits. In addition, the semiconductor chip itself may be cracked during the back-grinding.

BRIEF SUMMARY OF THE INVENTION

The various embodiments of the present invention provide a semiconductor package that is extremely thin without the need for conducting a back-grinding process or at least for reducing the amount of back-grinding that is required. In one embodiment of the present invention, there is provided a semiconductor package comprising a semiconductor chip provided with a plurality of bond pads, a chip paddle bonded to the bottom surface of the semiconductor chip via an adhesive, a plurality of leads formed at regular intervals along the perimeter of the chip paddle and conductive wires for electrically connecting the bond pads of the semiconductor chip to the leads. A package body comprises the semiconductor chip, the conductive wires, the chip paddle and the leads that are preferably encapsulated by an encapsulation material. The chip paddle, the leads and the tie bars are externally exposed at their side surfaces and bottom surfaces. The chip paddle is half-etched over the entire upper surface of the chip paddle, which results in a thinner thickness than the leads. In one embodiment of the present invention, the half-etched chip paddle is about 25-75% as thick as the leads. Accordingly, by half-etching the entire upper surface of the chip paddle, the chip paddle itself is made thinner than the leads, leading to the slimming of the semiconductor package.

BRIEF DESCRIPTION OF THE DRAWINGS

A more complete understanding of the method and apparatus of the present invention may be obtained by reference to the following detailed description, with like reference numerals denoting like elements, when taken in conjunction with the accompanying drawings wherein.

The present invention may be understood more readily by reference to the following detailed description of preferred embodiments of the present invention and the figures.

DETAILED DESCRIPTION OF THE INVENTION

Figure 1:
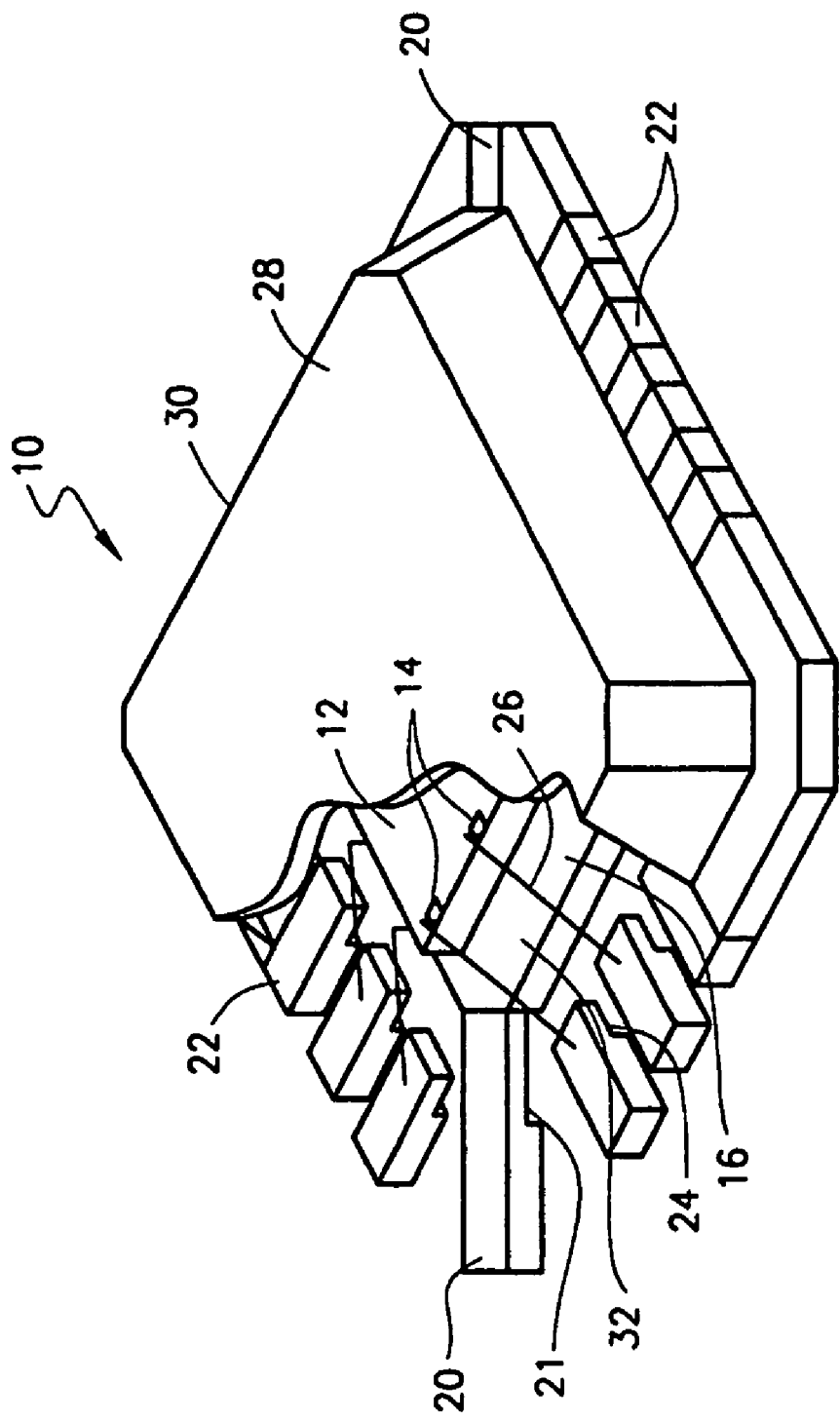
FIG. 1 is a cutaway perspective view of a semiconductor package incorporating the improved leadframe assembly of the present invention.
Figure 2:
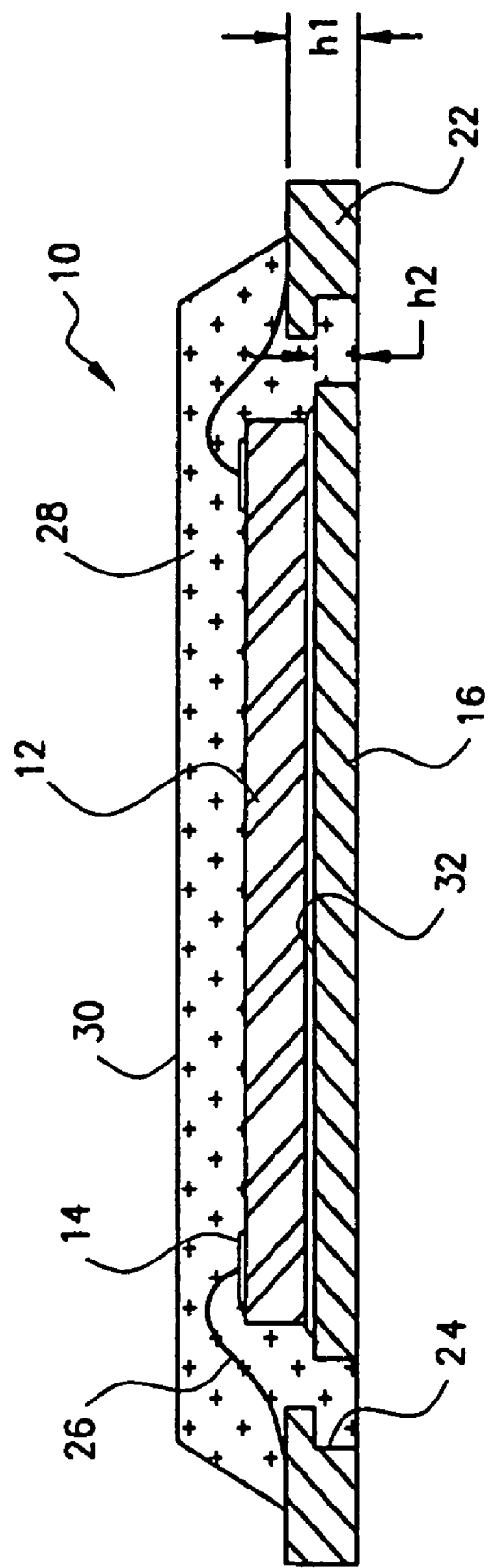
FIG. 2 shows a cross section of a semiconductor package wherein the semiconductor package has a chip paddle of reduced thickness according to one embodiment of the present invention.
Figure 3:
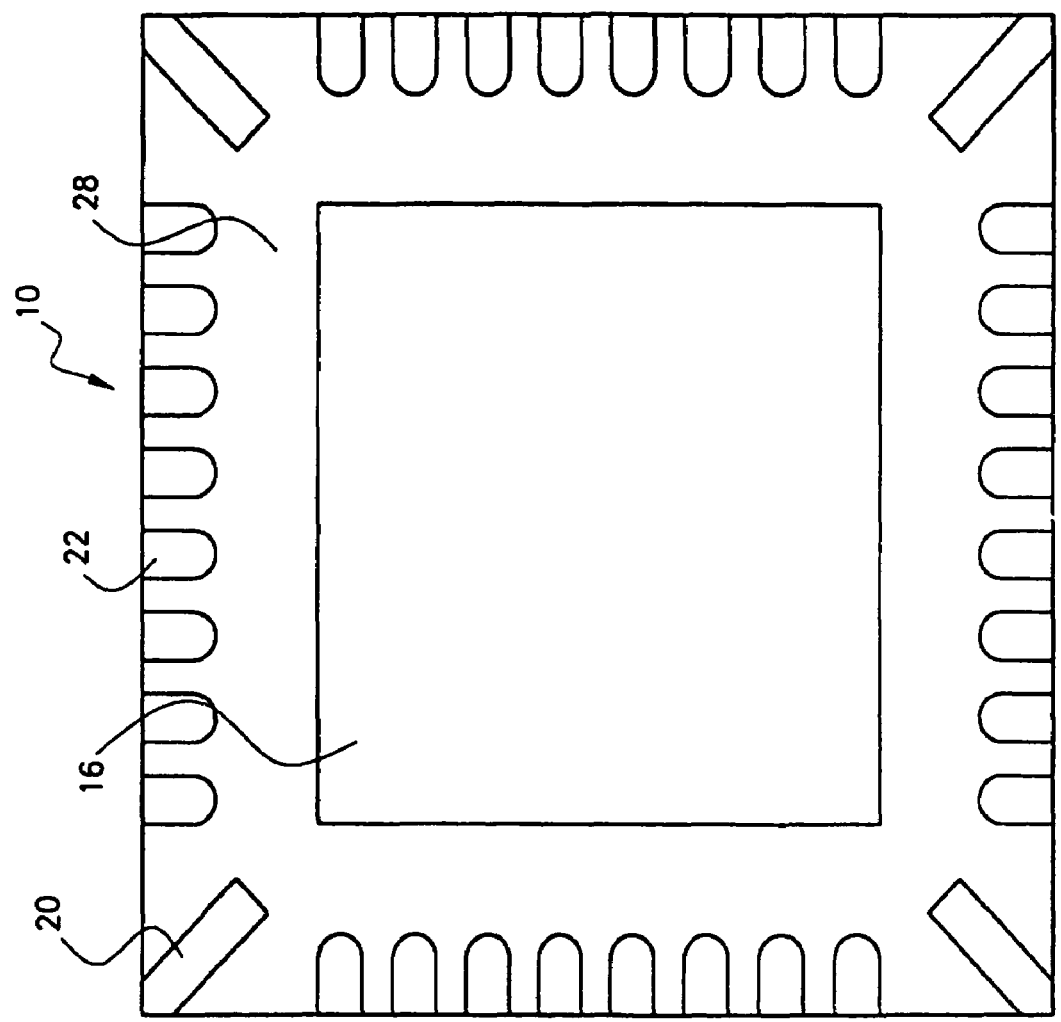
FIG. 3 shows a bottom plan view of the semiconductor package of FIG. 1.

Referring now to FIGS. 1, 2 and 3, a representative semiconductor package embodying aspects of the present invention is designated generally 10. Semiconductor package 10 comprises a semiconductor chip 12. Semiconductor chip 12 has a plurality of bond pads 14 on an upper surface of semiconductor chip 12 and along the perimeter of semiconductor chip 12. A chip paddle 16 is bonded to a bottom surface of semiconductor chip 12 via an adhesive. At a corner of chip paddle 16 is a tie bar 20 (FIGS. 1 & 2), which extends outwards toward a respective corner of the semiconductor package 10. The tie bar 20 preferably also has a half-etched portion 21 (FIG. 1).

A plurality of leads 22 are located along the circumference of chip paddle 16. The chip paddle 16 and the leads 22 are externally exposed at their bottom surfaces (see FIG. 2). Additionally, the leads 22 are exposed on their side faces (see FIG. 1). The externally exposed portions of the chip paddle 16 and the leads 22 may be electroplated with a corrosion minimizing material such as, but not limited to, tin lead, gold, nickel palladium, tin bismuth, or other similar materials known in the art. Each of leads 22 has a half-etched portion 24 at an end facing the chip paddle 16. The upper surface of each of leads 22 may also be electroplated with an electrical conductivity enhancing material such as, for example, gold or silver. Conductive wires 26 provide an electrical pathway between the bond pads 14 of the semiconductor chip 12 and the leads 22. The semiconductor chip 12, the conductive wires 26, the chip paddle 16 and the leads 22 are encapsulated by an encapsulation material 28 to create a package body 30 whereas the chip paddle 16, the leads 22 and the tie bars 20 are externally exposed toward the downward direction of the semiconductor package 10. The encapsulation material 28 may be thermoplastics or thermoset resins, with the thermoset resins including silicones, phenolics, and epoxies.

Figure 4:
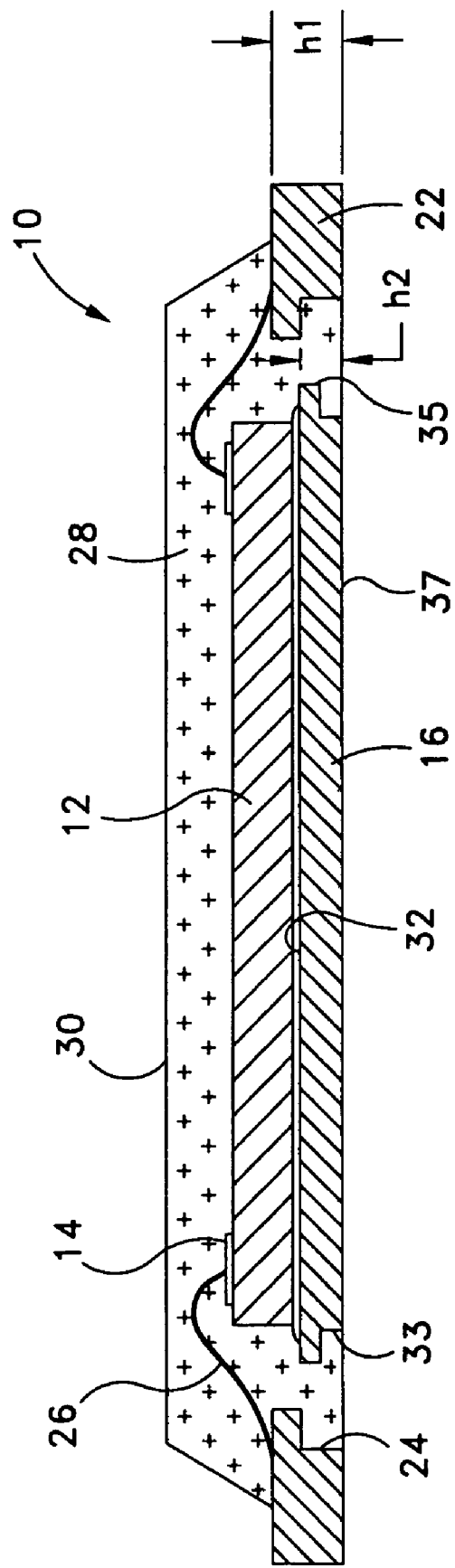
FIG. 4 shows a cross section of a semiconductor package wherein the semiconductor package has a chip paddle of reduced thickness and including a half-etched section according to another embodiment of the present invention.

An aspect of the various embodiments of the present invention resides in the formation of a half etched surface 32 over the entire upper surface of the chip paddle 16, so as to make the thickness of the chip paddle 16, designated h2 (FIG. 2), smaller than the thickness of the lead 22, which is designated h1 (FIG. 2). Preferably, the chip paddle 16 is about 25-75% as thick as the leads 22, but this range is presented for example only and should not be construed to limit the present invention. As shown in FIG. 4, in accordance with one embodiment of the present invention, the chip paddle 16 may include a half-etched section 33 which is located a lower edge 35 of the chip paddle 16. The half-etched section 33 extends to and at least partially circumvents the bottom surface 37 of the chip paddle 16.

It is also preferred that the formation of the half-etched surface 32 over the entire upper surface of the chip paddle 16 is conducted while a lower side area of the lead 22 is etched, e.g., to form half etched portion 24. However, the present invention is not limited to etching the top surface of chip paddle 16 and the half etched portion 24 of the leads 22 simultaneously.

By half-etching the entire upper surface of the chip paddle 16, the total height of the semiconductor package body 30 is reduced. When semiconductor chip 12 is mounted on the half-etched surface 32 of the chip paddle 16, the semiconductor chip 12 is positioned at a lower height than the semiconductor chip 12 would be if it were located on a non-etched chip paddle 16. Thus, the loop height of the conductive wires 26 is also lowered. An additional benefit is that the lower loop height of the conductive wires 26 decreases an occurrence of wire sweeping during encapsulation of the semiconductor package 10. Further, the low height of the semiconductor chip 12 results in decreasing the thickness of the semiconductor package 10.

The present invention has been described in an illustrative manner, and it is to be understood the terminology used is intended to be in the nature of descriptions rather than of limitation. Many modifications and variations of the present invention are possible in light of the above teachings.

As described hereinbefore, the chip paddle 16 is made thinner than the leads 22 by half-etching the entire upper surface of the chip paddle 16, so that the total thickness of the semiconductor package 10 can be decreased. In addition, the height of semiconductor chip 12

The following applications are being filed on the same date as the present application all incorporated by reference as if wholly rewritten entirely herein, including any al matter incorporated by reference therein:

| U.S. Pat. No./Ser. No. | Title of Application | First Named Inventor |
| --- | --- | --- |
| 6,646,339 | Improved Thin and Heat Radiant Semiconductor Package and Method for Manufacturing | Jae Hun Ku |
| 6,627,976 | Leadframe for Semiconductor Package and Mold for Molding the Same | Young Suk Chung |
| 6,475,827 | Method for Making a Semiconductor Package Having Improved Defect Testing and Increased Production Yield | Tae Heon Lee |
| 6,639,308 | Near Chip Size Semiconductor Package | Sean Timothy Crowley |
| 6,677,663 | End Grid Array Semiconductor Package | Jae Hun Ku |
| 09/687,048 | Leadframe and Semiconductor Package with Improved Solder Joint Strength | Tae Heon Lee |
| 6,555,899 | Semiconductor Leadframe Assembly and Method of Manufacture | Young Suk Chung |
| 6,525,406 | Semiconductor Device Having Increased Moisture Path and Increased Solder Joint Strength | Young Suk Chung |

It is this believed that the operation and construction of the present invention will be from the foregoing description of the preferred exemplary embodiments. It will be to a person of ordinary skill in the art that various changes and modifications may be rein without departing from the spirit and the scope of the invention.

It is this believed that the operation and construction of the present invention will be apparent from the foregoing description of the preferred exemplary embodiments. It will be obvious to a person of ordinary skill in the art that various changes and modifications may be made herein without departing from the spirit and the scope of the invention.

What is claimed is:

1. A semiconductor package, comprising:
   a leadframe comprising:
      a chip paddle defining opposed, generally planar top and bottom surfaces and a half-etched section which at least partially circumvents the bottom surface, the chip paddle having a paddle thickness between the top and bottom surfaces thereof; and
      a plurality of leads extending at least partially about the chip paddle, each of the leads having:
         opposed, generally planar upper and lower lead surfaces and a lead thickness between the upper and lower lead surfaces thereof;
         an inner lead end; and
         a half-etched portion formed within the lower lead surface and extending to the inner lead end, the half-etched portion defining an etched lead surface which is disposed in opposed relation to the upper lead surface;
   a semiconductor chip attached to the top surface of the chip paddle and electrically connected to at least one of the leads; and
   an encapsulation material at least partially encapsulating the leadframe and the semiconductor chip such that at least portions of the lower surfaces of the leads are exposed within the encapsulation material;
   wherein the lead thickness of each of the leads exceeds the paddle thickness such that the top surface of the chip paddle extends in generally co-planar relation to the etched lead surface of each of the leads.

2. The semiconductor package of claim 1 wherein the semiconductor chip is electrically connected to the upper lead surface of the at least one of the leads via a conductive wire which is encapsulated by the encapsulation material.

3. The semiconductor package of claim 1 wherein the bottom surface of the chip paddle is exposed within the encapsulation material and extends in generally co-planar relation to the lower lead surfaces of the leads.

4. The semiconductor package of claim 3 wherein the bottom surface of the chip paddle and the lower lead surfaces of the leads are each plated with a corrosion-minimizing material.

5. The semiconductor package of claim 1 wherein portions of the upper lead surfaces of each of the leads are exposed within the encapsulation material.

6. The semiconductor package of claim 1 wherein the leadframe further includes at least one tie bar attached to and extending from the chip paddle, the tie bar having:
   opposed, generally planar upper and lower tie bar surfaces; and
   a half-etched portion formed in the lower tie bar surface and defining an etched tie bar surface which is disposed in opposed relation to the upper tie bar surface.

7. The semiconductor package of claim 6 wherein:
   the tie bar and each of the leads each further have an outer end; and
   the outer ends and portions of the upper lead and tie bar surfaces are exposed within the encapsulation material.

8. The semiconductor package of claim 6 wherein the lower tie bar surface is exposed within the encapsulation material and extends in generally co-planar relation to the lower lead surfaces of the leads.

9. The semiconductor package of claim 8 wherein the bottom surface of the chip paddle is exposed within the encapsulation material and extends in generally co-planar relation to the lower lead and tie bar surfaces.

10. The semiconductor package of claim 9 wherein the bottom surface of the chip paddle and the lower lead and tie bar surfaces are each plated with a corrosion-minimizing material.

11. The semiconductor package of claim 6 wherein the etched tie bar surface extends in generally co-planar relation to the etched lead surface of each of the leads.

12. The semiconductor package of claim 1 wherein the chip paddle thickness is in the range of from about 25% to about 75% of the lead thickness of each of the leads.

13. The semiconductor package of claim 1 wherein the upper lead surface of the at least one of the leads is plated with an electrical conductivity enhancing material.

14. The semiconductor package of claim 1 wherein the semiconductor chip is secured to the top surface of the chip paddle via an adhesive.

15. A leadframe comprising:
   a chip paddle defining opposed, generally planar top and bottom surfaces and a half-etched section which at least partially circumvents the bottom surface, the chip paddle having a paddle thickness between the top and bottom surfaces thereof; and
   a plurality of leads extending at least partially about the die paddle, each of the leads having:
      opposed, generally planar upper and lower lead surfaces and a lead thickness between the upper and lower lead surfaces thereof;
      an inner lead end; and
      a half-etched portion formed within the lower lead surface and extending to the inner lead end, the half-etched portion defining an etched lead surface which is disposed in opposed relation to the upper lead surface;
   wherein the lead thickness of each of the leads exceeds the paddle thickness such that the top surface of the chip paddle extends in generally co-planar relation to the etched lead surface of each of the leads.

16. The leadframe of claim 15 wherein the bottom surface of the chip paddle extends in generally co-planar relation to the lower lead surfaces of the leads.

17. The leadframe of claim 15 further including at least one tie bar attached to and extending from the chip paddle, the tie bar having:
   opposed, generally planar upper and lower tie bar surfaces; and
   a half-etched portion formed in the lower tie bar surface and defining an etched tie bar surface which is disposed in opposed relation to the upper tie bar surface.

18. The leadframe of claim 17 wherein the lower tie bar surface extends in generally co-planar relation to the lower lead surfaces of the leads.

19. The leadframe of claim 15 wherein the chip paddle thickness is in the range of from about 25% to about 75% of the lead thickness of each of the leads.

20. A semiconductor package, comprising:
a leadframe comprising:
- a chip paddle defining opposed, generally planar top and bottom surfaces and a half-etched section which at least partially circumvents the bottom surface, the chip paddle having a paddle thickness between the top and bottom surfaces thereof; and
- a plurality of leads extending at least partially about the chip paddle, each of the leads having:
  - opposed, generally planar upper and lower lead surfaces and a lead thickness between the upper and lower lead surfaces thereof;
  - an inner lead end; and
  - a half-etched portion formed within the lower lead surface and extending to the inner lead end, the half-etched portion defining an etched lead surface which is disposed in opposed relation to the upper lead surface;
- a semiconductor chip attached to the top surface of the chip paddle and electrically connected to at least one of the leads; and
- an encapsulation material at least partially encapsulating the leadframe and the semiconductor chip such that at least portions of the lower surfaces of the leads are exposed within the encapsulation material;
- wherein the chip paddle thickness is in the range of from about 25% to about 75% of the lead thickness of each of the leads.

* * * * *